(12) United States Patent
Sakayori

(10) Patent No.: US 6,958,612 B2
(45) Date of Patent: Oct. 25, 2005

(54) APPARATUS FOR CALIBRATING HIGH FREQUENCY SIGNAL MEASUREMENT EQUIPMENT

(75) Inventor: Hiroshi Sakayori, Kanagawa (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/455,659

(22) Filed: Jun. 5, 2003

(65) Prior Publication Data

US 2003/0234654 A1 Dec. 25, 2003

(30) Foreign Application Priority Data

Jun. 21, 2002 (JP) ........................................ 2002-181122

(51) Int. Cl.[7] .............................................. G01R 35/00
(52) U.S. Cl. ...................................................... 324/601
(58) Field of Search ............................. 324/601, 76.15, 324/605, 606, 607; 702/107; 327/50, 51, 54

(56) References Cited

U.S. PATENT DOCUMENTS 4,472,676 A * 9/1984 Eichmann et al. .......... 324/509
5,933,013 A * 8/1999 Kimura ....................... 324/601
6,215,295 B1 * 4/2001 Smith, III .................... 324/95
6,459,335 B1 * 10/2002 Darmawaskita et al. ...... 330/9

OTHER PUBLICATIONS

Nuhrmann, Dieter. "Output Dividers for Calibration Voltages," 1998, pp 3847/3848, English translation.

"High Frequency Probe DC to 6 GHz", Model HP 54006A, Sep. 1993, pps. 1–2 and 6–8, Operation Note, Hewlett–Packard Company.

"Operation and Service Manual, Agilent Technologies 11612A Bias Network Includes Option 001.", Dec. 1989, 4 pp., Agilent Technologies, Inc.

* cited by examiner

Primary Examiner—Vincent Q. Nguyen
Assistant Examiner—John Teresinski

(57) ABSTRACT

An apparatus for calibrating the DC voltage level of measurement equipment supplies a calibration voltage through a DC voltage superposition means to the measurement equipment, detects the voltage level supplied to the measurement equipment, and adjusts the calibration voltage. Therefore, in the high-frequency range, the calibration apparatus can reduce the effect on the measurement accuracy of the measurement equipment and supply a highly accurate calibration voltage to the measurement equipment.

13 Claims, 4 Drawing Sheets

APPARATUS FOR CALIBRATING HIGH FREQUENCY SIGNAL MEASUREMENT EQUIPMENT

BACKGROUND OF THE INVENTION

1. Field of the Invention

The present invention relates to an apparatus provided in measurement equipment for calibrating the DC voltage level of the measurement equipment and, more particularly, to a calibration apparatus that reduces the effect on the measurement accuracy when the measurement equipment measures a high-frequency signal.

2. Description of the Prior Art

A semiconductor tester provides a calibration apparatus at the input thereof for stabilizing and accurately measuring the signal to be measured. FIG. 1 is a schematic drawing of a conventional semiconductor tester. The calibration apparatus provided therein is explained.

In FIG. 1, the semiconductor tester 100 is comprised of an input terminal 110 for receiving the signal to be measured, measurement equipment 120 for measuring the signal to be measured, and a calibration apparatus 130 for calibrating the DC voltage level of the measurement equipment. The calibration apparatus 130 is comprised of a switch 131 and a reference voltage source 132. The switch 131 is provided between the output of the reference voltage source 132 and the input of the measurement equipment 120 and connects or disconnects the reference voltage source 132 and the measurement equipment 120. The reference voltage source 132 outputs a DC voltage for calibration.

In this specification, the voltage for calibration is also referred to as the calibration voltage.

When the semiconductor tester 100 measures a signal, the switch 131 enters the open state. Then the measurement equipment 120 measures the signal received at the input terminal 110. When the semiconductor tester 100 self calibrates, the switch 131 enters the conducting state. The measurement equipment 120 reads in a specified reference voltage output from the reference voltage source 132. Furthermore, the measured voltage and the output voltage of the reference voltage source 132 are compared. If a difference arises between the two voltages, the measurement equipment 120 is calibrated so that the difference disappears, and the calibration ends.

Problems related to the measurement accuracy are produced when a high-frequency signal is measured in a semiconductor tester configured as described above. In general, a switch has a signal line between the terminal for connecting to an external circuit and the actual switch mechanism, and the connecting side in the switch mechanism also becomes a signal line. This kind of signal line forms an open stub when the switch is in the open state. The open stub behaves as a capacitive load or an inductive load and has an effect on the frequency characteristics of a circuit or equipment connected by the open stub.

Usually, measurement equipment that handles high-frequency signals is adjusted so that the input impedance thereof is 50 ohms. Since the resistance of the signal line from the reference voltage source 132 to the measurement equipment 120 has a value that cannot be ignored compared to the input impedance (50 ohms), the voltage applied to the measurement equipment 120 cannot be controlled with high accuracy.

To solve the above-mentioned problems, for example, switch 131 can be changed to a single-pole, double-throw (SPDT) switch. FIG. 2 shows a semiconductor tester including a calibration apparatus using an SPDT switch. The semiconductor tester 200 in FIG. 2 comprises an input terminal 210 for receiving the signal to be measured, measurement equipment 220 for measuring the signal to be measured, and a calibration apparatus 230 for calibrating the DC voltage level of the measurement equipment. The calibration apparatus 230 comprises a switch 231 that is a high-frequency SPDT switch and a reference voltage source 232. When the semiconductor tester 200 measures a signal, the switch 231 enables conduction between the input terminal 210 and the measurement equipment 220. When the semiconductor tester 200 is self calibrating, the switch 231 enables conduction between the reference voltage source 232 and the measurement equipment 220. The SPDT switch, for example, can be an RF switch 8762A from Agilent Technologies.

If a high-frequency SPDT switch as described above is used, the open stub problem is eliminated. However, this kind of switch is large and expensive, and has a short lifetime. It is desirable that the semiconductor tester be able to operate continuously for a long time period. Furthermore, since a smaller sized and less expensive switch has been demanded in recent years, new solution techniques are desired.

SUMMARY OF THE INVENTION

The present invention solves the problems of the conventional techniques described above in light of market demand. One object of the present invention is for the calibration apparatus to reduce the effect on the measurement accuracy of a high-frequency signal of the measurement equipment by providing a calibration voltage to the measurement equipment by DC voltage superposition means in an apparatus for calibrating the DC voltage level of measurement equipment.

A further object is to supply a highly accurate calibration voltage to the measurement equipment by detecting the voltage level supplied to the measurement equipment and adjusting the calibration voltage in the apparatus for calibrating the DC voltage level of the measurement equipment.

DETAILED DESCRIPTION OF THE INVENTION

To achieve the above-mentioned objects, the present invention is an apparatus for calibrating the DC voltage level of equipment connected to a signal transmission path and measures a signal in the signal transmission path. The calibration apparatus comprises a calibration voltage generation means adjacent to and connected to the signal transmission path for detecting the signal level in the signal transmission path and adjusting the output voltage level in response to the detected level, DC voltage superposition means adjacent to and connected to the signal transmission path for superposing the output voltage of the calibration voltage generation means on the signal transmission path, and a switch provided between the calibration voltage generation means and the DC voltage superposition means.

The present invention provides probe means adjacent to and connected to the signal transmission path for alternately isolating the signal transmission path and the calibration voltage generation means.

Figure 1:
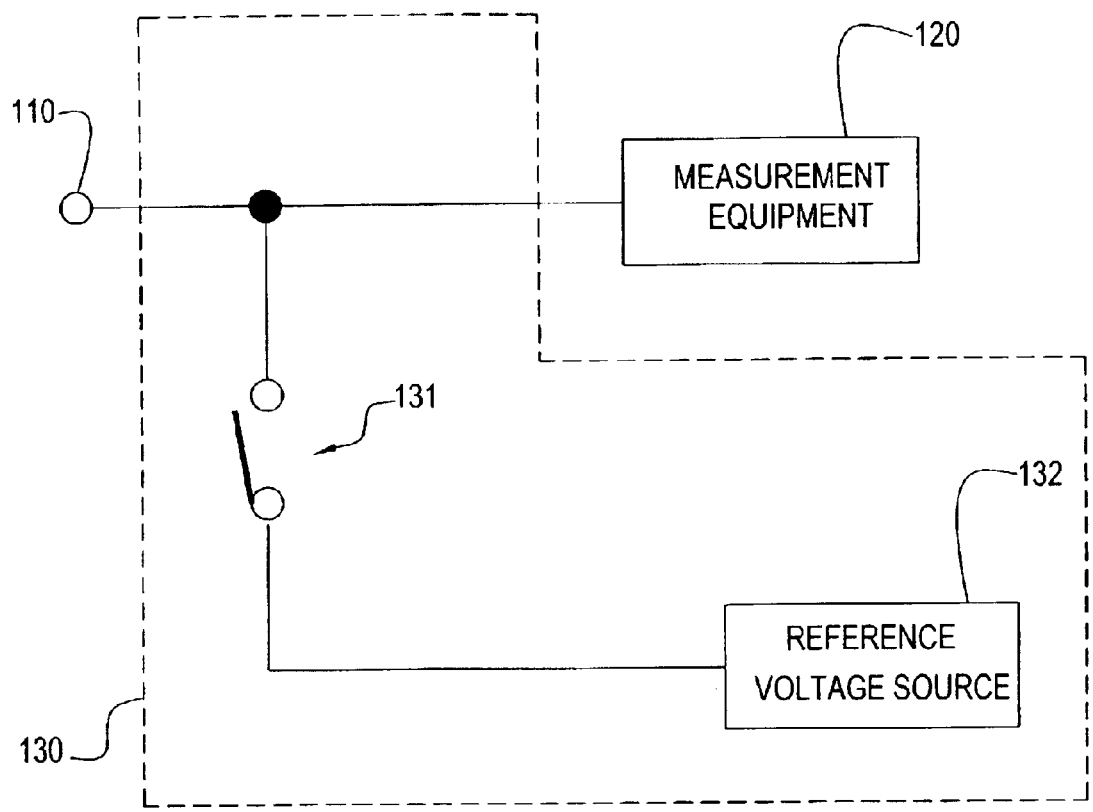
FIG. 1 is a view showing a semiconductor tester including a first calibration apparatus according to conventional technology.
Figure 2:
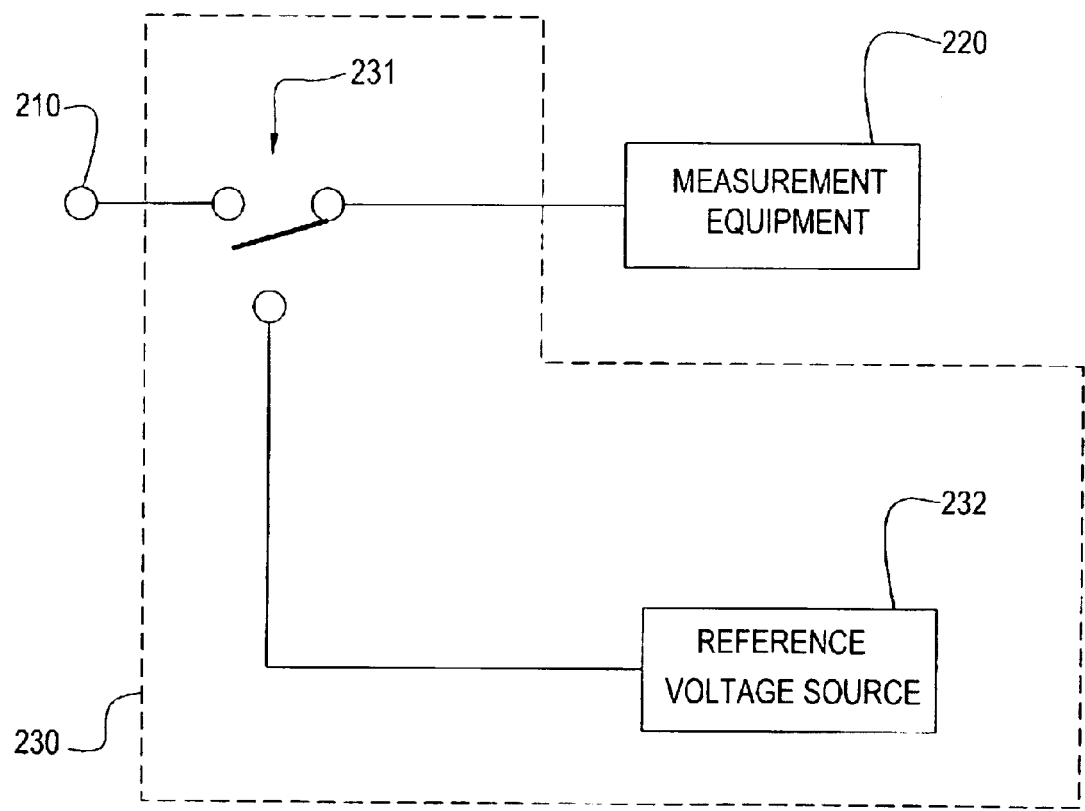
FIG. 2 is a view showing a semiconductor tester including a second calibration apparatus according to conventional technology.
Figure 3:
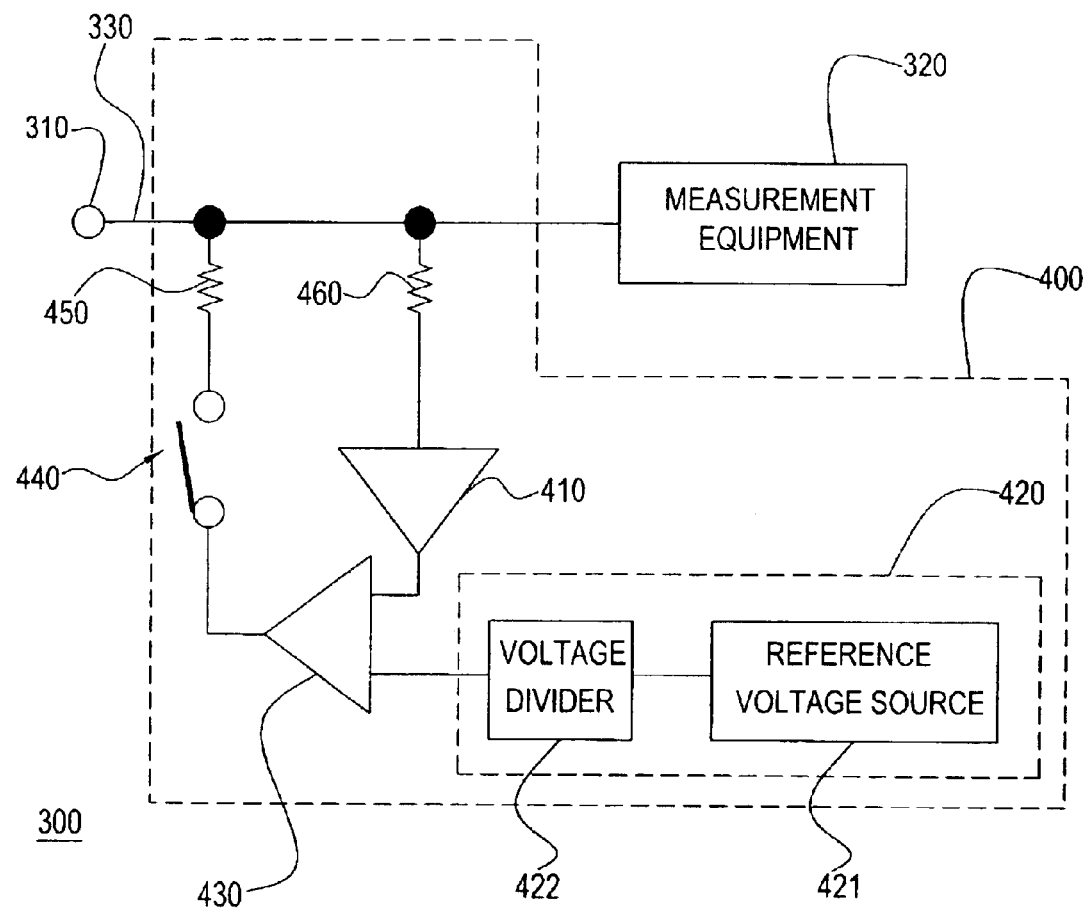
FIG. 3 is a view showing a semiconductor tester including a calibration apparatus according to the present invention.

The present invention is explained based on the embodiments shown in the attached drawings. A first embodiment is a semiconductor tester provided with a calibration apparatus. FIG. 3 shows the structure thereof.

In FIG. 3, the semiconductor tester 300 comprises an input terminal 310 for receiving the signal to be measured, measurement equipment 320 for measuring the signal to be measured, a signal transmission path 330 for connecting the input terminal 310 to the measurement equipment 320, and calibration apparatus 400 for calibrating the DC voltage level of the measurement equipment.

The calibration apparatus 400 comprises a buffer 410 connected through a resistor 460 to the signal transmission path 330, a reference voltage generation apparatus 420, a differential amplifier 430 connected to the buffer 410 and the reference voltage generation apparatus 420, a reed switch 440 provided between the differential amplifier 430 and the signal transmission path 330, and a resistor 450 provided between the signal transmission path 330 and the reed switch 440.

Buffer 410 is an example of the signal level detection means and detects the voltage of the signal transmission path 330 and outputs a voltage equal thereto. In addition, the buffer 410 has high input resistance and minute input capacitance.

The reference voltage generation apparatus 420 is an example of the reference voltage generation means and comprises a reference voltage source 421 and a voltage divider 422 that divides and outputs the output voltage of the reference voltage source 421 via the voltage divider 422. The voltage divider 422 includes a plurality of resistors and varies the voltage division ratio by selectively introducing resistors.

The differential amplifier 430 is an example of the calculation means. It compares and calculates the output voltage level of the buffer 410 and the output voltage level of the reference voltage generation apparatus 420, and changes the output voltage level in response to the calculation result.

The resistor 450 is an example of the DC voltage superposition means and is adjacent to and connected to the signal transmission path 330 so that the length of the lead from the actual resistance component to the signal transmission path 330 is sufficiently shorter than the measurement signal wavelength. The resistor 460 is an example of the probe means and is adjacent to and connected to the signal transmission path 330 so that the length of the lead from the actual resistance component to the signal transmission path 330 is sufficiently shorter than the measurement signal wavelength.

The operation of the semiconductor tester 300 configured as described above is explained.

When the semiconductor tester 300 measures a signal, the reed switch 440 enters the open state and the measurement equipment 320 monitors or measures a signal in the signal transmission path 330. At this time, the signal in the signal transmission path 330 is transferred to the reed switch 440 through the resistor 450 and not just to the measurement equipment 320. Since the reed switch 440 is in the open state, most of the signal is reflected at the connection point. The reflected signal returns again to the signal transmission path 330 through the resistor 450. By setting the resistance of the resistor 450 to a sufficiently large value, the reflected signal level returned to the signal transmission path 330 can be suppressed to a small level, and interference between the signals generated in the signal transmission path 330 can be prevented.

Similarly, the signal in the signal transmission path 330 is transferred to the buffer 410 through the resistor 460. A portion of the signal is reflected by the buffer 410 and is returned again to the signal transmission path 330 through the resistor 460. By setting the resistance of the resistor 460 to a sufficiently large value, the level of the reflected signal returned to the signal transmission path 330 can be suppressed to a low level, and interference between the signals generated in the signal transmission path 330 can be prevented. In addition, the buffer 410 has an extremely large input resistance. Therefore, the effect reaching the DC signal in the signal transmission path 330 is small. However, the buffer 410 has capacitive input characteristics and acts as a low impedance load to an alternating current (ac) signal. The resistor 460 limits the flow of the ac signal in the signal transmission path 330 into the buffer 410. The buffer 410 suppresses the effect reaching the ac signal in the signal transmission path 330.

Furthermore, the problems of resistor 450 and resistor 460 adjacent to and connected to the signal transmission path 330 such as signal interference can be ignored because the leads, that is, the actual stub lengths, are sufficiently short.

When the semiconductor tester 300 is self calibrating, the reed switch 440 enters the conducting state. The voltage divider 422 is set to the specified voltage division ratio through external control, and the reference voltage generation apparatus 420 generates the specified reference voltage. The buffer 410 detects the voltage level in the signal transmission path 330 through the resistor 460 and outputs a voltage at the same level.

The differential amplifier 430 compares the output voltage level of the reference voltage generation apparatus 420 and the output voltage level of the buffer 410 and outputs the voltage difference. The output voltage of the differential amplifier 430 is dropped by the resistor 450 and is superposed on the signal transmission path 330 by the resistor 450.

In the feedback loop formed in this manner, until the output voltage level of the reference voltage generation apparatus 420 and the output voltage level of the buffer 410 become the same, the output voltage level of the differential amplifier 430 changes. Consequently, the voltage level of the signal transmission path 330 becomes equal to the output voltage level of the reference voltage generation apparatus 420. The output voltage from the reference voltage generation apparatus 420 is set to the specified value by the voltage division of the resistors. Since the resistance of a resistor is highly accurate in the low-frequency range, the output voltage level of the reference voltage generation apparatus 420 has nearly the same accuracy as the accuracy of the internal reference voltage source.

The two types of DC voltage level calibration are DC offset calibration and DC gain calibration. In DC offset calibration, the output voltage level of the reference voltage generation apparatus 420 is set to zero, and the voltage of the signal transmission path 330 is measured by the measurement equipment 320. The measured voltage level and the output voltage level of the reference voltage generation apparatus 420 are compared. If a difference develops between the two voltage levels, the measurement equipment 320 is calibrated so that the difference is eliminated, and the calibration ends.

In DC gain calibration, the output voltage level of the reference voltage generation apparatus 420 is set to a specified value other than zero, and the measurement equipment 320 is similarly calibrated.

Figure 4:
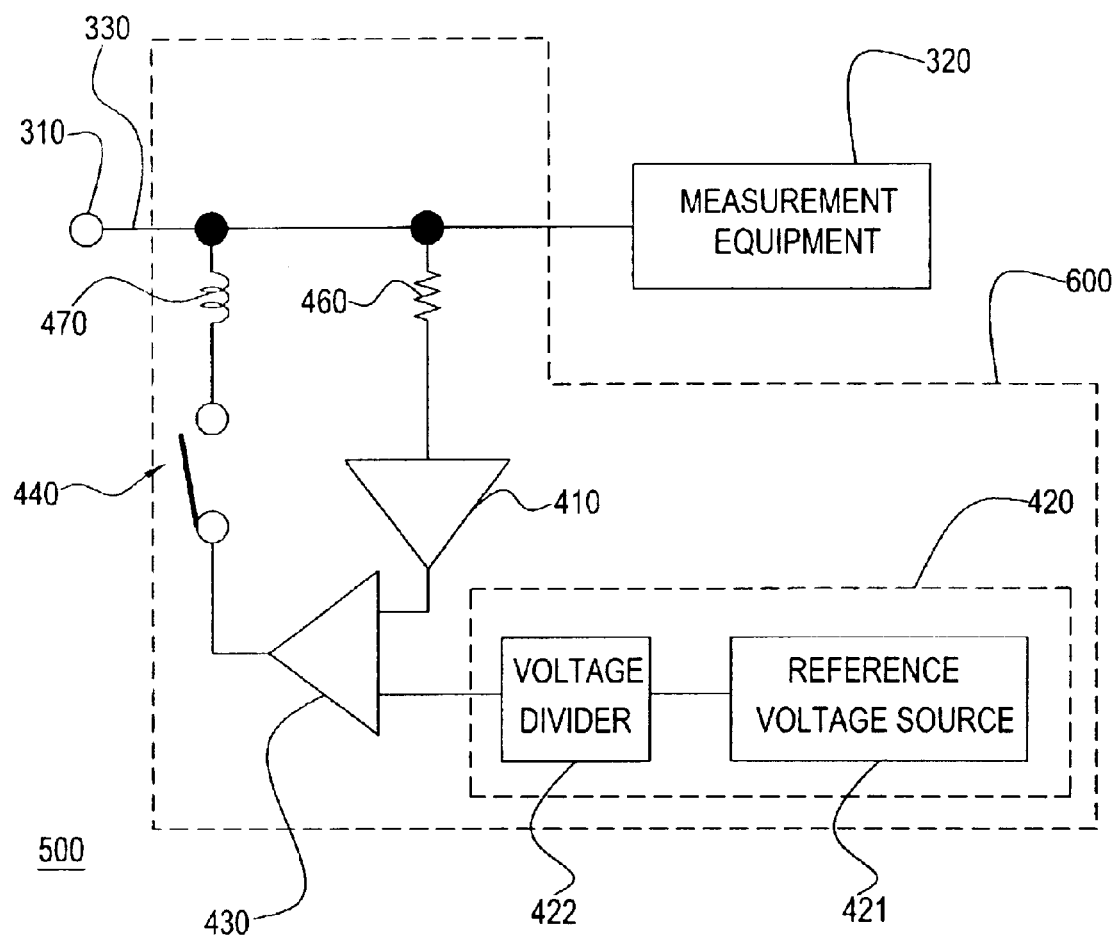
FIG. 4 is a view showing a semiconductor tester including a calibration apparatus according to another embodiment of the present invention.

The resistor 450, which is an example of the DC voltage superposition means, can be replaced by another circuit element if the output voltage of the differential amplifier 430 can be DC superposed on the signal transmission path 330. For example, this kind of circuit element is an inductor. FIG. 4 shows another embodiment of the semiconductor tester where resistor 450 is replaced by an inductor. The other circuit elements, except for the inductor 470 in the semiconductor tester 500 in FIG. 4, are preferably the same circuit elements provided in the semiconductor tester 300 shown in FIG. 3.

The inductor 470 has lower impedance in the low-frequency range and has higher impedance as the frequency increases. The semiconductor tester 500 not only measures the signal received from the object to be measured connected to the input terminal 310, but sometimes supplies power to the object to be measured through the input terminal. For example, an IC with an open collector output is the object to be measured. When the differential amplifier 430 supplies power to the object to be measured, if the DC voltage superposition means is an inductor, the power loss is low, and the situation is favorable compared to a resistor. The inductor 470 has a large inductance in order to obtain a large impedance from the low-frequency range. However, the problem of a single inductor is the floating capacitance between the windings to realize the inductor. In practice, a plurality of inductors are connected, whereby an inductor having an equivalent large inductance is realized.

The resistor 460, which is an example of the probe means, can be replaced by another circuit element if the flow of the ac signal in the signal transmission path 330 into the buffer 410 is blocked or limited, and the buffer 410 can restrict the effect reaching the ac signal in the signal transmission path 330. For example, similar to the resistor 450, an inductor can be used. In this case too, a plurality of connected inductors may be used.

Further, the reference voltage generation apparatus 420 can be replaced by another circuit element if the level accuracy of the output voltage satisfies the specifications. For example, an analog-to-digital converter can be used. Recently, highly accurate, compact analog-to-digital converters could be obtained. If an analog-to-digital converter is used, an advantage is the dedicated area for the printed-circuit board can be reduced compared to when using a voltage divider and a reference voltage source.

Further, when measuring a signal, in order to completely isolate the calibration apparatus 400 or 600 from the signal transmission path 330, a switch can be added between the resistor 460 and the buffer 410.

The inductor 470 and the resistor 460 are connected to different locations on the signal transmission path 330, but can be connected at the same location.

If the voltage drop from the location connecting the resistor 460 on the signal transmission path 330 to the measurement equipment 320 due to the DC resistance of the signal transmission path 330 becomes a problem, the location connecting the resistor 460 on the signal transmission path 330 can be close to the measurement equipment 320. In this case, the location connecting the inductor 470 on the signal transmission path 330 is preferably between the location connecting the resistor 460 on the signal transmission path 330 and the input terminal 310.

As explained in detail above, the present invention operates and supplies a calibrated voltage to the measurement equipment through DC voltage superposition means in an apparatus for calibrating the DC voltage level of measurement equipment. The calibration apparatus can reduce the effect on the measurement accuracy of a high-frequency signal of the measurement equipment.

The apparatus for calibrating the DC voltage level of measurement equipment can supply a highly accurate calibration voltage to the measurement equipment by detecting the voltage level supplied to the measurement equipment and adjusting the calibration voltage.

Further, by providing probe means for alternately isolating the signal transmission path and the calibration voltage generation means in the apparatus for calibrating the DC voltage level of the measurement equipment, the calibration voltage generation means can suppress the effect on the ac signal of the signal transmission path, for example, when the calibration voltage generation means has capacitive input characteristics.

Examples of preferred embodiments of the present invention were described in detail. However, it should be understood that the foregoing description is only illustrative of a present implementation of the teachings herein. Various alternatives and modification may be devised by those skilled in the art without departing from the present invention. Accordingly, the present invention is intended to embrace all such alternatives, modifications, and variances that fall within the scope of the disclosure herein.

I claim:

1. A calibration apparatus for calibrating the direct current (DC) voltage level of measurement equipment connected to a signal transmission path and measuring a signal in the signal transmission path, said calibration apparatus comprising:
    a calibration voltage generator that is connected to said signal transmission path, that detects a signal level in said signal transmission path and that adjusts an output voltage level thereof in response to said detected level;
    a DC voltage superposition means connected to said signal transmission path and superposing said output voltage of said calibration voltage generator on said signal transmission path; and
    a switch disposed between said calibration voltage generator and said DC voltage superposition means to conduct said output voltage of said calibration voltage generator to said DC voltage superposition means.

2. The apparatus according to claim 1, wherein said DC voltage superposition means is a resistor or an inductor.

3. The apparatus according to claim 1 further comprising a probe connected to said signal transmission path and selectively isolating said signal transmission path and said calibration voltage generator.

4. The apparatus according to claim 3, wherein said probe is a resistor or an inductor.

5. The apparatus according to claim 3, wherein said probe connected to said signal transmission path is connected such that a length of a stub formed by the connection thereof is sufficiently shorter than a measurement signal wavelength of said measurement equipment.

6. The apparatus according to claim 1, wherein said calibration voltage generator comprises:
   a signal level detector that is connected to said signal transmission path and that detects said signal level in the signal transmission path;
   a reference voltage generator; and
   calculation circuitry for comparing and calculating said output voltage level of the signal level detector and an output voltage level of said reference voltage generator, and adjusting an output voltage level of said calculation circuitry in response to the calculation.

7. The calibration apparatus according to claim 6, wherein said signal level detector is a buffer.

8. The calibration apparatus according to claim 6, wherein said reference voltage generator comprises a reference voltage source and a voltage divider for varying a voltage by selectively varying a ratio of resistors.

9. The calibration apparatus according to claim 6, wherein said reference voltage generator includes a digital-to-analog converter.

10. The calibration apparatus according to claim 6, wherein said calculation circuitry includes a differential amplifier.

11. The apparatus according to claim 1, wherein said calibration voltage generator and said DC voltage superposition means connected to said signal transmission path are connected such that a length of a stub formed by the connections thereof is sufficiently shorter than a measurement signal wavelength of said measurement equipment.

12. A calibration apparatus for calibrating a DC voltage level of equipment connected to a signal transmission path and measuring a signal in the signal transmission path comprising:
   a buffer for detecting a voltage level of said signal transmission path;
   a reference voltage source;
   a voltage divider connected to said reference voltage source and for varying a voltage by selectively varying a ratio of resistors;
   a differential amplifier for comparing and calculating an output signal level of said the buffer and an output signal level of said voltage divider;
   a switch for conducting an output signal of said differential amplifier to said signal transmission path;
   a first resistor connected to said signal transmission path and said switch and superposing an output signal of said differential amplifier on said signal transmission path; and
   a second resistor connected to said signal transmission path and an input terminal of said buffer.

13. The apparatus according to claim 12, wherein said first and second resistors connected to said signal transmission path are connected such that a length of a stub formed by the connections thereof is sufficiently shorter than a measurement signal wavelength of said measurement equipment.

* * * * *